(12) United States Patent
Otsubo

(10) Patent No.: US 9,241,409 B2
(45) Date of Patent: Jan. 19, 2016

(54) COMPONENT-EMBEDDED RESIN SUBSTRATE

(71) Applicant: Murata Manufacturing Co., Ltd., Kyoto (JP)

(72) Inventor: Yoshihito Otsubo, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 113 days.

(21) Appl. No.: 14/255,610

(22) Filed: Apr. 17, 2014

(65) Prior Publication Data

US 2014/0226288 A1 Aug. 14, 2014

Related U.S. Application Data

(63) Continuation of application No. PCT/JP2012/073323, filed on Sep. 12, 2012.

(30) Foreign Application Priority Data

Oct. 21, 2011 (JP) ................................. 2011-231683

(51) Int. Cl.
*H05K 1/18* (2006.01)
*H01L 23/14* (2006.01)
(Continued)

(52) U.S. Cl.
CPC .............. *H05K 1/185* (2013.01); *H01L 23/145* (2013.01); *H01L 23/49822* (2013.01);
(Continued)

(58) Field of Classification Search
CPC ..... H05K 3/284; H05K 7/142; H05K 1/0306; H05K 1/0231; H01L 2924/01079; H01L 2924/01078; H01L 2224/48091
USPC ......... 361/748, 750, 760–763, 766, 782–784, 361/790, 795, 812; 257/773
See application file for complete search history.

(56) References Cited

U.S. PATENT DOCUMENTS 7,186,919 B2 * 3/2007 Kim ...................... H05K 1/162
174/250
8,314,343 B2 * 11/2012 Inoue ...................... H01L 24/24
174/255
2004/0226744 A1 11/2004 Asahi et al.

FOREIGN PATENT DOCUMENTS

CN 1551719 A 12/2004
JP 2005-005692 A 1/2005
(Continued)

OTHER PUBLICATIONS

International Search Report for Application No. PCT/JP2012/073323 dated Oct. 23, 2012.
Written Opinion of the International Searching Authority for Application No. PCT/JP2012/073323 dated Oct. 23, 2012.

*Primary Examiner* — Hoa C Nguyen
*Assistant Examiner* — Roseline Alicea Rivera
(74) *Attorney, Agent, or Firm* — Pearne & Gordon LLP

(57) ABSTRACT

A component-embedded resin substrate includes a plurality of embedded components arranged as embedded in a resin structure. The plurality of embedded components include a first embedded component and a second embedded component. When viewed in a direction of the lamination, a first distance from the first embedded component to the closest end surface is shorter than a second distance from the second embedded component to the closest end surface. A first projection area calculated by multiplying a length along the end surface when the first embedded component is projected on the closest end surface to the first embedded component by a thickness of the first embedded component is smaller than a second projection area calculated by multiplying a length along the end surface when the second embedded component is projected on the closest end surface to the second embedded component by a thickness of the second embedded component.

3 Claims, 13 Drawing Sheets

(51) Int. Cl.
*H01L 23/498* (2006.01)
*H05K 3/46* (2006.01)

(52) U.S. Cl.
CPC ...... *H01L 2924/0002* (2013.01); *H05K 3/4644* (2013.01); *H05K 2201/041* (2013.01); *H05K 2201/10431* (2013.01); *H05K 2201/10636* (2013.01)

(56) References Cited

FOREIGN PATENT DOCUMENTS

| | | |
|---|---|---|
| JP | 2005-197354 A | 7/2005 |
| JP | 2006-073763 A | 3/2006 |
| JP | 2010-016107 A | 1/2010 |

* cited by examiner

COMPONENT-EMBEDDED RESIN SUBSTRATE

BACKGROUND OF THE INVENTION

1. Field of the Invention

The present invention relates to a component-embedded resin substrate.

2. Description of the Related Art

FIG. 23 shows one example of a component-embedded resin substrate based on the conventional art. In this example, in the inside of a component-embedded resin substrate 901, a resin layer 2 serving as an insulating layer surrounds an outer periphery of an embedded component 3. Component-embedded resin substrate 901 contains a plurality of via conductors 6 and a plurality of conductor patterns 7. As shown in FIG. 24, embedded component 3 is substantially in a parallelepiped shape and has electrodes 3a, 3b at respective opposing end portions. As shown in FIG. 23, via conductors 6n are connected to electrodes 3a, 3b of embedded component 3, respectively.

Japanese Patent Laying-Open No. 2006-73763 (PTD 1) describes one example of a method of manufacturing a component-embedded resin substrate based on the conventional art. According to the invention described in PTD 1, a resin film in which a through hole for insertion of a chip-like embedded component is formed is stacked, and an embedded component is inserted in a recess portion formed by a series of through holes. Six protrusions are formed on an inner surface of this recess portion, and a distance Wt between tip ends of the protrusions opposed to each other is set to be smaller than an outer dimension W2 of the embedded component. In inserting an embedded component in a recess portion, the embedded component is pressed in while tip ends of these protrusions are collapsed. According to the invention described in PTD 1, after the embedded component is pressed in the recess portion, a provisional adhesion step is performed and thereafter the step of applying pressure to this stack is further performed while the stack is heated. Thus, the resin films are press-bonded, and consequently, a multi-layered substrate is obtained.

PTD 1: Japanese Patent Laying-Open No. 2006-73763

BRIEF SUMMARY OF THE INVENTION

Though protrusions are provided on the inner surface of the recess portion for accommodating an embedded component in PTD 1, regardless of the presence or absence of such protrusions, in order to reliably arrange an embedded component in the recess portion, the recess portion is usually provided to have a sufficient size larger than an outer geometry of the embedded component. FIGS. 25 and 26 show in a cross-sectional view and in a plan view respectively, a state that an embedded component is arranged in such a recess portion. Embedded component 3 is arranged in the recess portion. Since the recess portion is greater than embedded component 3, a gap 9 is created to surround the outer periphery of embedded component 3.

By performing the step of applying pressure to the stack while the stack is heated, that is, the press-bonding step, a phenomenon called "resin flow" or "resin flux" takes place in the stack, which means that a resin which is a material for a resin sheet deforms under the influence of externally applied pressure and it flows in the inside of the stack. It is expected that, owing to this resin flow, the resin flows into the gap and the gap is completely filled with the resin.

If the number of components to be embedded in a component-embedded resin substrate increases, however, depending on a position of arrangement, an amount of resin which flows in is short and a gap may not sufficiently be filled.

Then, an object of the present invention is to provide a component-embedded resin substrate in which a gap around an embedded component can sufficiently be filled in a press-bonding step and reliability of connection between the embedded component and a resin layer can be improved.

In order to achieve the object above, a component-embedded resin substrate based on the present invention includes a resin structure including a plurality of laminated resin layers and having an end surface surrounding an outer periphery of the resin layers and a plurality of embedded components arranged as embedded in the resin structure. The plurality of embedded components include a first embedded component and a second embedded component. When viewed in a direction of the lamination, a first distance which is a distance from the first embedded component to a portion of the end surface closest to the first embedded component is shorter than a second distance which is a distance from the second embedded component to a portion of the end surface closest to the second embedded component. A first projection area calculated by multiplying a length of the first embedded component along the end surface when the first embedded component is projected on a portion of the end surface closest to the first embedded component when viewed in the direction of the lamination by a thickness of the first embedded component is smaller than a second projection area calculated by multiplying a length of the second embedded component along the end surface when the second embedded component is projected on a portion of the end surface closest to the second embedded component when viewed in the direction of the lamination by a thickness of the second embedded component.

According to the present invention, since a first embedded component which appears to have a smaller area when viewed from an end surface is arranged at a position closer to the end surface and a second embedded component which appears to have a larger area when viewed from the end surface is arranged at a position far from the end surface, such a situation that an amount of resin which flows in a gap is short and the gap is not sufficiently filled less likely occurs, and a component-embedded resin substrate in which a gap around an embedded component can sufficiently be filled in a press-bonding step and reliability of connection between the embedded component and a resin layer can be improved can be obtained.

DETAILED DESCRIPTION OF THE INVENTION (First Embodiment)

Figure 1:
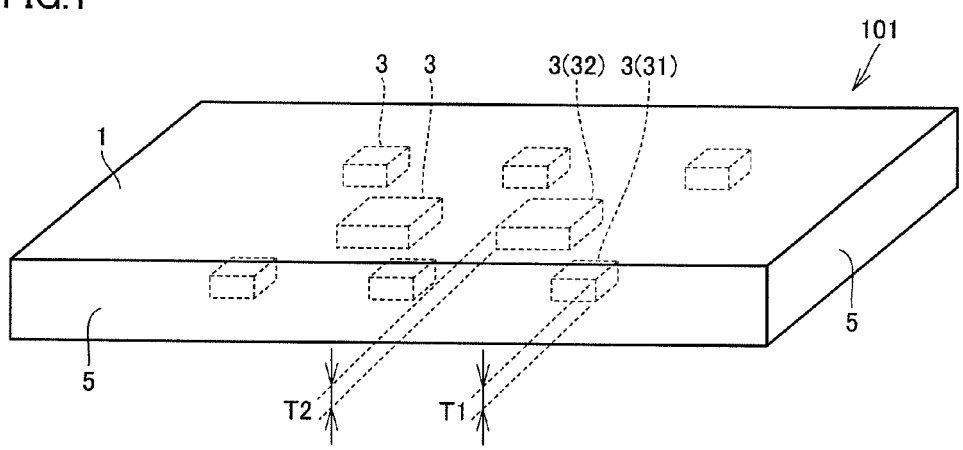
FIG. 1 is a perspective view of a component-embedded resin substrate in a first embodiment based on the present invention.
Figure 2:
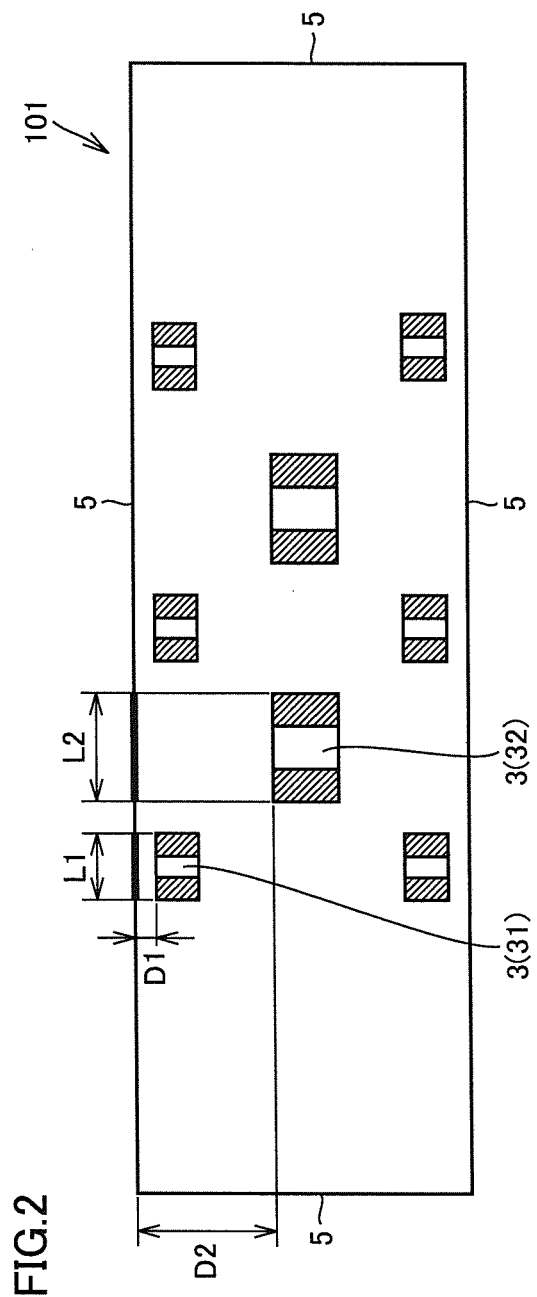
FIG. 2 is a perspective plan view of the component-embedded resin substrate in the first embodiment based on the present invention.

A component-embedded resin substrate in a first embodiment based on the present invention will be described with reference to FIGS. 1 and 2. Since embedded component 3 is hidden in a resin structure 1 in FIG. 1, any embedded component 3 is drawn with a dashed line. Though resin structure 1 may have already been integrated, it originally includes a plurality of laminated resin layers. FIG. 2 shows a component-embedded resin substrate 101 as seen through in a direction of the lamination for description of positional relation of embedded components 3. Therefore, in FIG. 2, embedded component 3 hidden in resin structure 1 is drawn with a solid line. FIGS. 1 and 2 do not show a conductor pattern and a via conductor arranged on a surface or in the inside of resin structure 1, which is also the case with a perspective plan view below.

As shown in FIG. 1, component-embedded resin substrate 101 in the present embodiment includes resin structure 1 including a plurality of laminated resin layers and having an end surface 5 surrounding an outer periphery of the resin layers and a plurality of embedded components 3 arranged as embedded in resin structure 1. As shown in FIG. 2, the plurality of embedded components 3 include a first embedded component 31 and a second embedded component 32. When viewed in a direction of the lamination, a first distance D1 which is a distance from first embedded component 31 to end surface 5 closest to first embedded component 31 is shorter than a second distance D2 which is a distance from second embedded component 32 to end surface 5 closest to second embedded component 32.

A length along end surface 5 when first embedded component 31 is projected on end surface 5 closest to first embedded component 31 when viewed in the direction of the lamination is defined as a first projection length L1 and a thickness of first embedded component 31 is defined as T1. A product calculated by multiplying first projection length L1 by thickness T1 is defined as a first projection area S1. On the other hand, a length along end surface 5 when second embedded component 32 is projected on end surface 5 closest to second embedded component 32 when viewed in the direction of the lamination is defined as a second projection length L2 and a thickness of second embedded component 32 is defined as T2. A product calculated by multiplying second projection length L2 by thickness T2 is defined as a second projection area S2. First projection area S1 is smaller than second projection area S2.

In other words, it can be said in component-embedded resin substrate 101 in the present embodiment that an embedded component which appears to have a smaller area when viewed from end surface 5 is arranged at a position close to end surface 5, that is, on an "outer side", and an embedded component which appears to have a larger area when viewed from end surface 5 is arranged at a position far from end surface 5, that is on an "inner side".

It is noted that FIG. 2 shows the projection of an embedded component on a closest end surface with a bold line. First projection length L1 and second projection length L2 each correspond to a length of the bold line.

Figure 3:
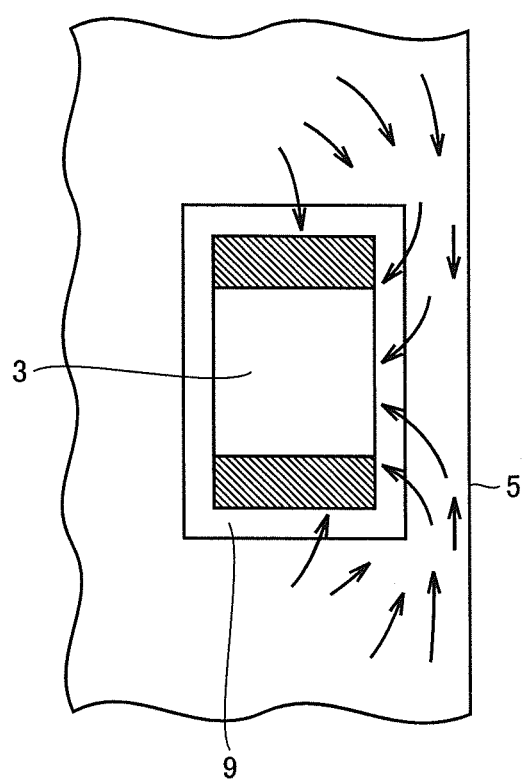
FIG. 3 is a diagram illustrating a manner of resin flow around an embedded component arranged at a position close to an end surface.

At a site on the inner side of the component-embedded resin substrate, there is sufficient resin therearound, and hence a gap is likely to be filled with resin flow during press-bonding, whereas at a site on the outer side of the component-embedded resin substrate, an amount of resin therearound is limited. Therefore, such a situation that, even when resin flow occurs at the time of press-bonding, an amount of resin which flows into the gap is short and the gap is not filled more likely occurs. In particular, in a case of an embedded component of which area appears to be larger when viewed from the end surface, as shown in FIG. 3, a distance by which the resin should go around is long and such a situation that a gap is not sufficiently filled more likely occurs. According to the present embodiment, however, since first embedded component 31 which is an embedded component which appears to have a smaller area when viewed from the end surface is arranged at a position close to the end surface and second embedded component 32 which is an embedded component which appears to have a larger area when viewed from the end surface is arranged at a position far from the end surface, such a situation that an amount of resin which flows into the gap is in short and the gap is not sufficiently filled less likely occurs. Namely, it is possible to provide a component-embedded resin substrate in which a gap around an embedded component can sufficiently be filled in the press-bonding step. Since a gap in the surrounding can sufficiently be filled in the present embodiment, the reliability of connection between an embedded component and a resin layer can be improved. Thus, the suppression of the peel-off of a resin around an embedded component is also expected.

Figure 4:
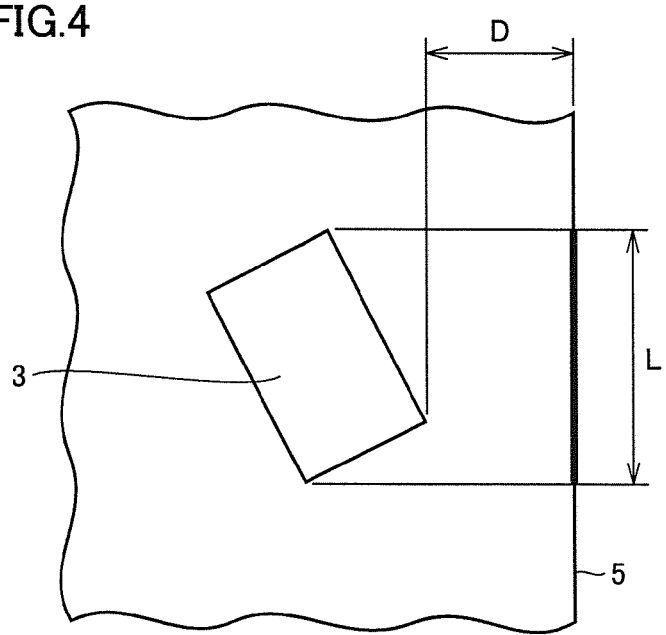
FIG. 4 is a first illustrative diagram showing a relation between an embedded component and a projection length.

In addition, for ensuring the reliability, a concept of a "projection length" will be described. An embedded component may be arranged in such a position that no side is in parallel to the closest end surface. In that case, as shown in FIG. 4, a length of a shaded portion obtained by projecting embedded component 3 perpendicularly on end surface 5 is defined as a projection length L. For example, even though embedded component 3 has an elongated shape, depending on positional relation with end surface 5, projection length L may be short as shown in FIG. 5.

Furthermore, description has been given so far on the premise that an embedded component is in a rectangular shape, however, in considering the present invention, the embedded component is not limited to a rectangular shape. An embedded component may be in any shape. For example, even though embedded component 3 has an irregular shape as shown in FIG. 6, length L at the time of the projection on closest end surface 5 should only be considered.

Figure 5:
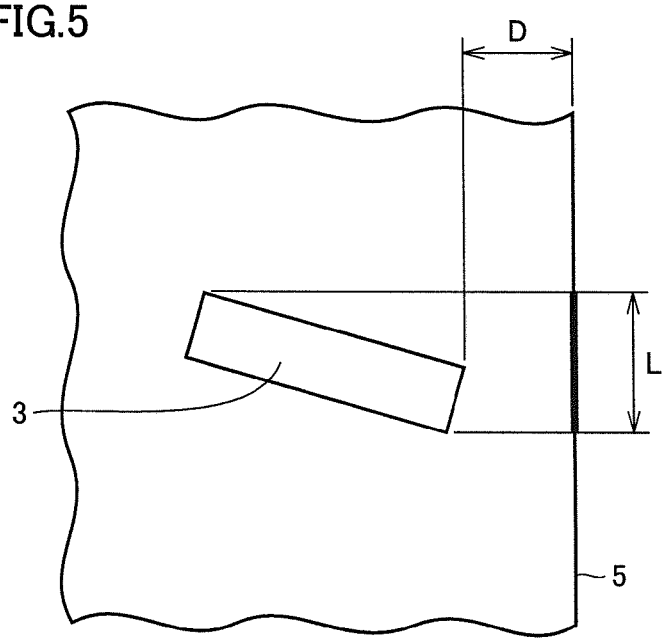
FIG. 5 is a second illustrative diagram showing a relation between an embedded component and a projection length.
Figure 6:
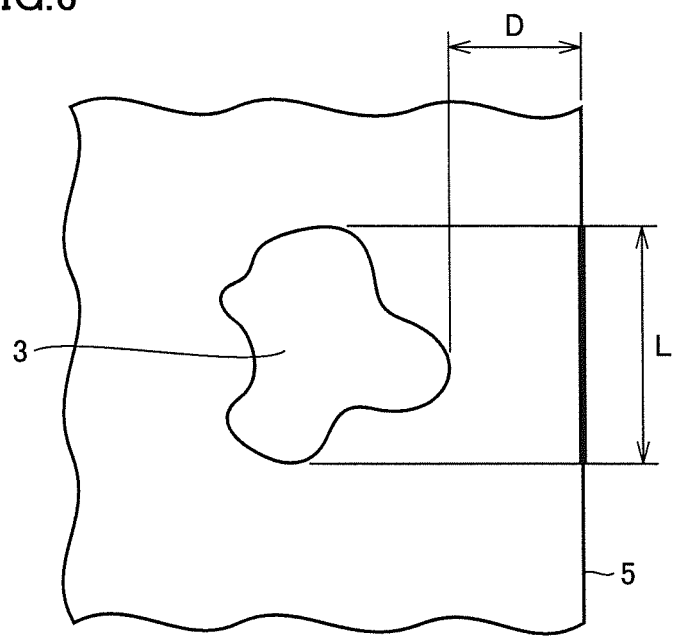
FIG. 6 is a third illustrative diagram showing a relation between an embedded component and a projection length.

As shown in FIGS. 4 to 6, a distance D to the end surface means a distance from a point closest to the end surface of an outer geometry of the embedded component to the end surface.

(Second Embodiment)

Though description has been given in the first embodiment with attention being paid to two embedded components, description will be given in a second embodiment based on the present invention with attention being paid to three embedded components.

Figure 7:
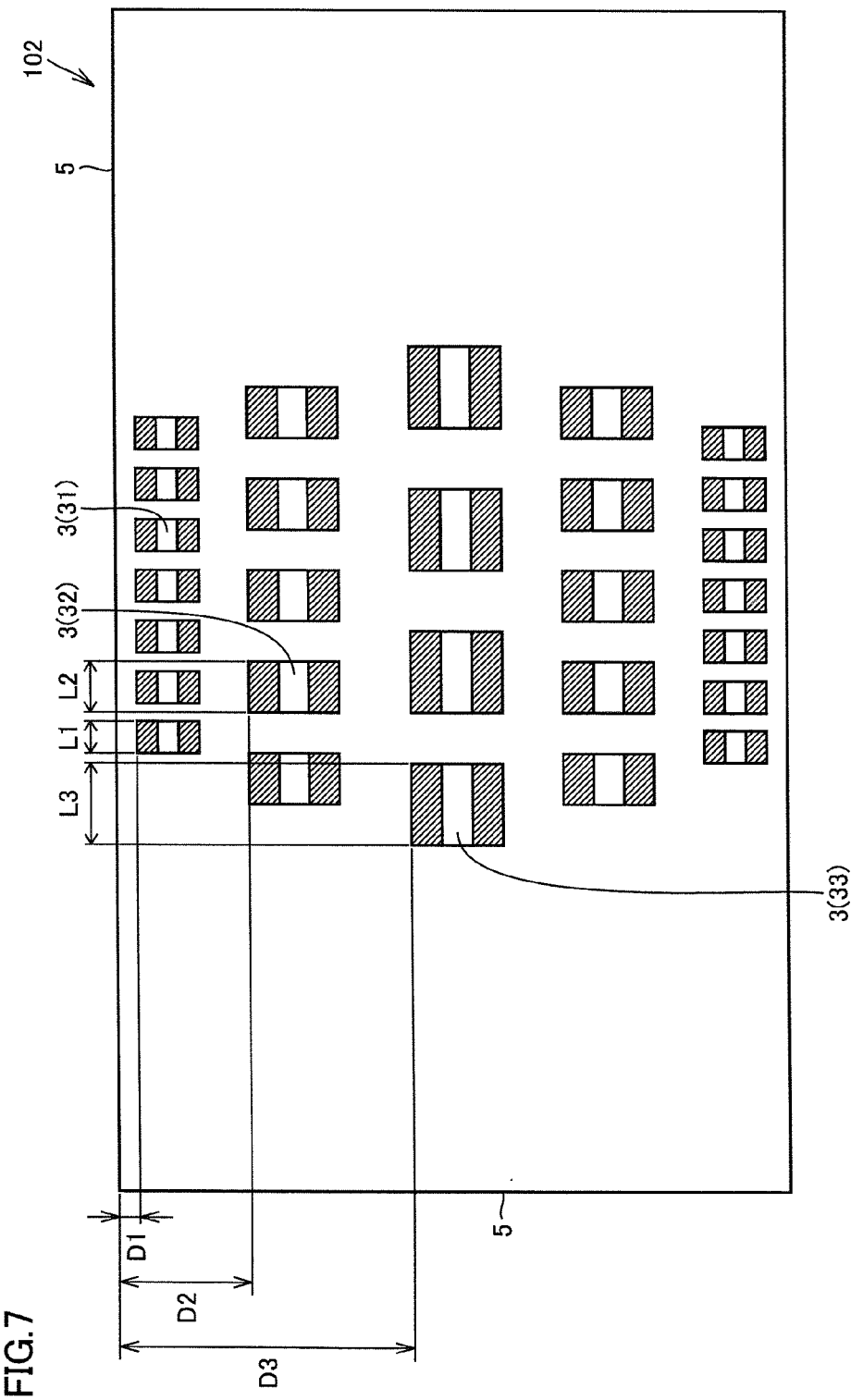
FIG. 7 is a perspective plan view of a component-embedded resin substrate in a second embodiment based on the present invention.

As shown in FIG. 7, a component-embedded resin substrate 102 in the present embodiment satisfies a condition as described in the first embodiment, and further additionally satisfies a condition below. Namely, in component-embedded resin substrate 102, a plurality of embedded components 3 include a third embedded component 33. A third distance D3 which is a distance from third embedded component 33 to end surface 5 closest to third embedded component 33 when viewed in the direction of the lamination is longer than second distance D2. A length along end surface 5 when third embedded component 33 is projected on end surface 5 closest to third embedded component 33 when viewed in the direction of the lamination is defined as a third projection length L3 and a thickness of third embedded component 33 is defined as T3. A product calculated by multiplying third projection length L3 by thickness T3 is defined as a third projection area S3. Third projection area S3 is larger than second projection area S2.

In other words, it can be said in component-embedded resin substrate 102 in the present embodiment that an embedded component which appears to have a smaller area when viewed from end surface 5 is arranged at a position closer to end surface 5, that is on the "outer side", and an embedded component which appears to have a larger area when viewed from end surface 5 is arranged at a position farther from end surface 5, that is on the "inner side".

In the present embodiment, regarding the plurality of embedded components 3, since the embedded components are arranged in accordance with the rules described above depending on how large an area is when viewed from the closest end surface, such a situation that an amount of resin which flows into a gap is short and the gap is not sufficiently filled less likely occurs. Namely, it is possible to provide a component-embedded resin substrate in which a gap around an embedded component in the press-bonding step can sufficiently be filled.

(Third Embodiment)

Figure 8:
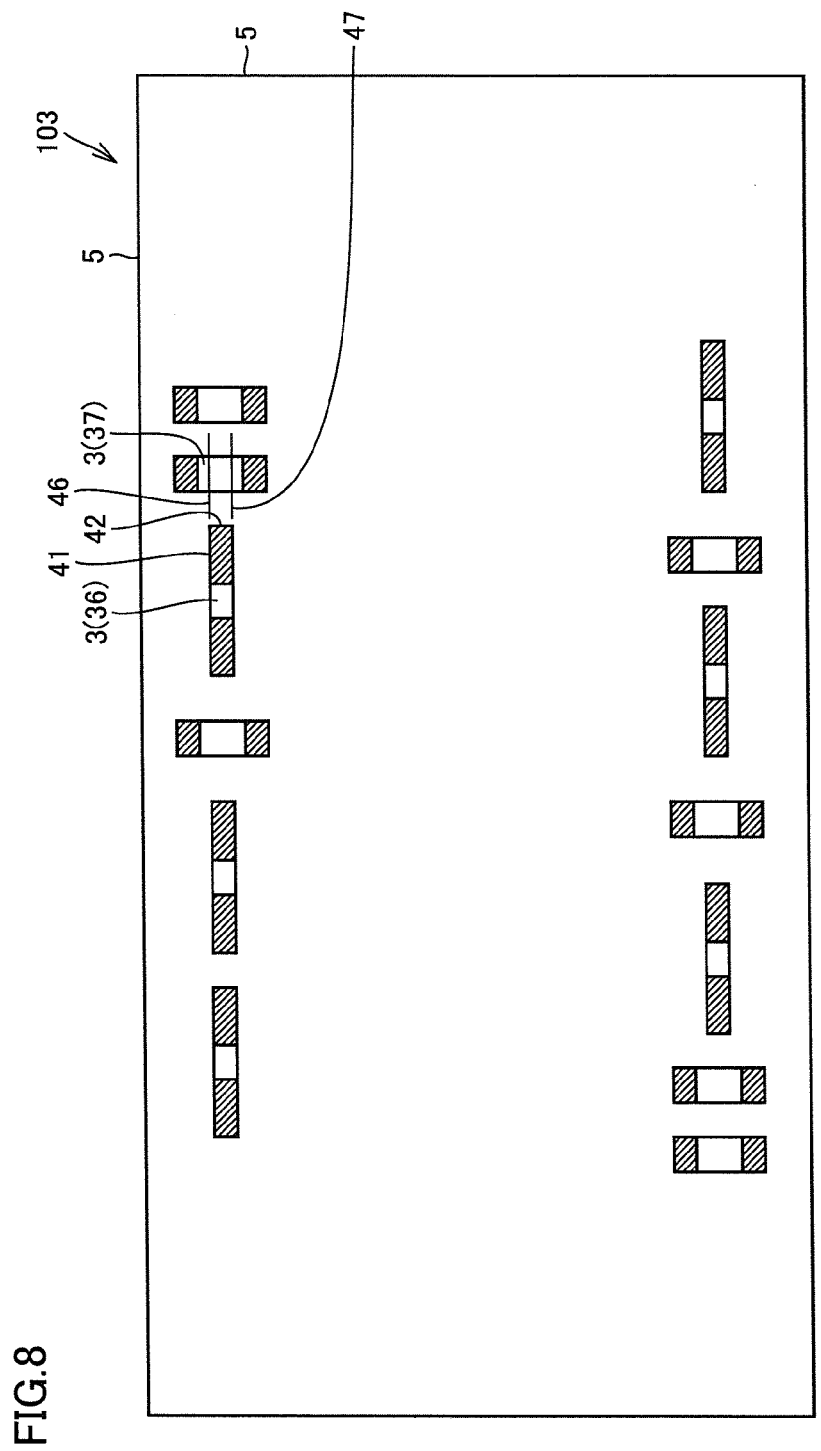
FIG. 8 is a perspective plan view of a specific example of a component-embedded resin substrate in a third embodiment based on the present invention.

A component-embedded resin substrate in a third embodiment based on the present invention will be described with reference to FIG. 8. A component-embedded resin substrate 103 in the present embodiment includes the features in the first embodiment. In addition, in component-embedded resin substrate 103, each of the plurality of embedded components 3 has a rectangular outer geometry when viewed in the direction of the lamination and has a rectangular electrode with a long side 41 and a short side 42 so as to overlap with a line of the rectangular outer geometry at an end portion of the rectangle when viewed in the direction of the lamination. When any one embedded component 3 arbitrarily selected from the plurality of embedded components 3 is defined as a reference embedded component 36, another embedded component 37 closest to reference embedded component 36 is arranged at such a position that at least a part of embedded component 37 is included in a region lying between two straight lines 46, 47 drawn perpendicularly to short side 42 outward from reference embedded component 36, from opposing ends of a side of reference embedded component 36 overlapping with short side 42 of the electrode.

Figure 9:
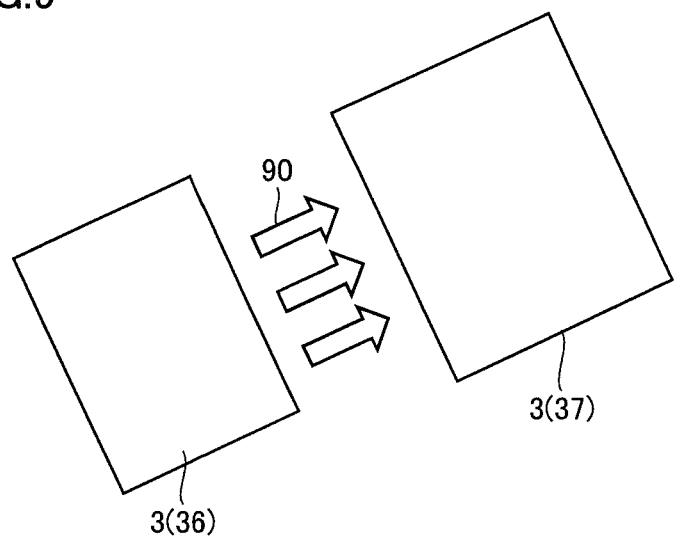
FIG. 9 is an illustrative diagram of displacement caused between a reference embedded component and another embedded component.
Figure 10:
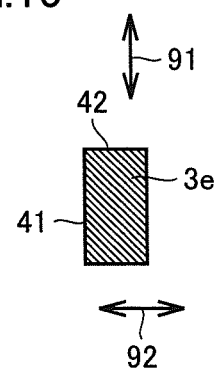
FIG. 10 is an illustrative diagram of displacement of an electrode of the embedded component.

In a case that an embedded component has an electrode which appears to be rectangular when viewed in the direction of the lamination, the embedded component is displaced by the resin flow caused around this embedded component during the press-bonding, and consequently, there is a concern about the displacement of a position of the electrode and the resulting defective contact of the electrode. In particular, when certain embedded component 3 is defined as reference embedded component 36 as shown in FIG. 9, at a location where reference embedded component 36 is proximate to another embedded component 37, reference embedded component 36 tends to be displaced in an orientation 90 toward another embedded component 37. As shown in FIG. 10, when an electrode 3e provided in embedded component 3 is in a rectangular shape when viewed in the direction of the lamination, electrode 3e has a wide allowable range for the displacement along a direction 91 in parallel to long side 41, whereas it has a narrow allowable range for the displacement along a direction 92 in parallel to short side 42. This is because a connection electrode in a shape corresponding to a shape of electrode 3e provided in embedded component 3 is formed on a surface in contact with embedded component 3 by a conductor pattern or a via conductor and connected to electrode 3e. When electrode 3e has a rectangular shape when viewed in the direction of the lamination, normally, the connection electrode is also similarly in a rectangular shape when viewed in the direction of the lamination.

In the present embodiment, however, another embedded component 37 closest to reference embedded component 36 is arranged at such a position that at least a part of another embedded component 37 is included in a region lying between two straight lines 46, 47 drawn perpendicularly to short side 42 outward from reference embedded component 36, from opposing ends of a side of reference embedded component 36 overlapping with short side 42 of electrode 3e of reference embedded component 36. Therefore, even though a component is displaced due to resin flow, a direction of displacement tends to be a direction in parallel to a long side and it can be said as arrangement resistant to displacement of components.

(Manufacturing Method)

Figure 11:
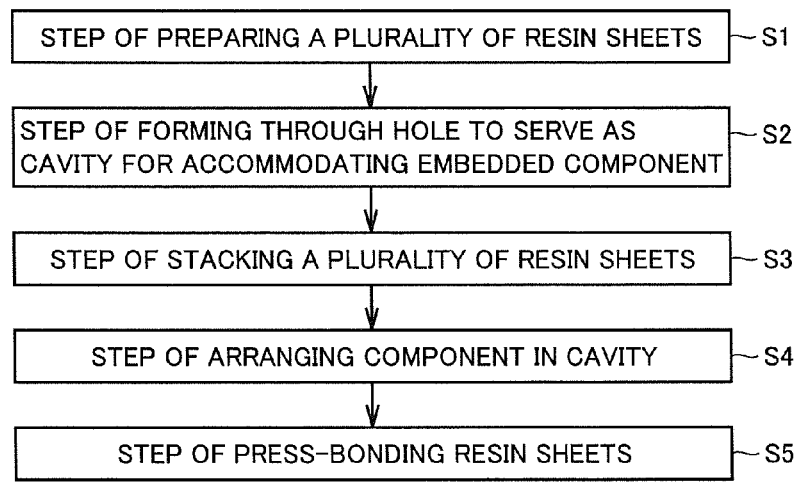
FIG. 11 is a flowchart of a method of manufacturing a component-embedded resin substrate based on the present invention.

A method of manufacturing a component-embedded resin substrate based on the present invention will be described in detail with reference to the drawings. FIG. 11 shows a flowchart of this method of manufacturing a component-embedded resin substrate.

Figure 12:
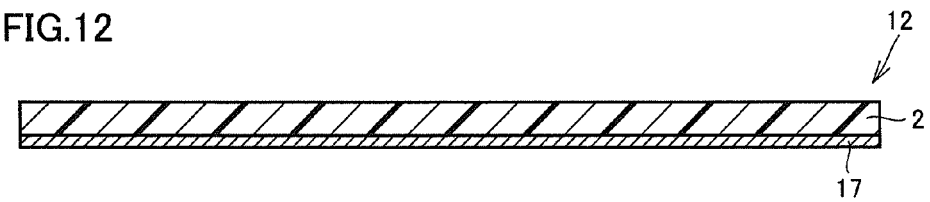
FIG. 12 is a diagram illustrating a first step of the method of manufacturing a component-embedded resin substrate based on the present invention.

Initially, as a step S1, a resin sheet with conductor foil 12 as shown in FIG. 12 is prepared. Resin sheet with conductor foil 12 is a sheet having such a structure that a conductor foil 17 is attached to one surface of resin layer 2. Resin layer 2 is composed, for example, of LCP (liquid crystal polymer) which is a thermoplastic resin. In addition to LCP, materials for resin layer 2 may include PEEK (polyether ether ketone), PEI (polyether imide), PPS (polyphenylene sulfide), PI (polyimide), and the like. Conductor foil 17 is a foil having a thickness of 18 μm and composed, for example, of Cu. It is noted that, other than Cu, materials for conductor foil 17 may include Ag, Al, SUS, Ni, Au, and alloys of two or more different metals selected from these metals. Though conductor foil 17 has a thickness of 18 μm in the present embodiment, conductor foil 17 may have a thickness approximately from at least 3 μm to at most 40 μm. Conductor foil 17 should only have such a thickness that is capable of forming a circuit.

"Preparing a plurality of resin sheets" in step S1 means preparing a plurality of resin sheets with conductor foil 12, or preparing a resin sheet 12 with a single conductor foil that should subsequently be cut individually into a plurality of resin sheets.

Figure 13:
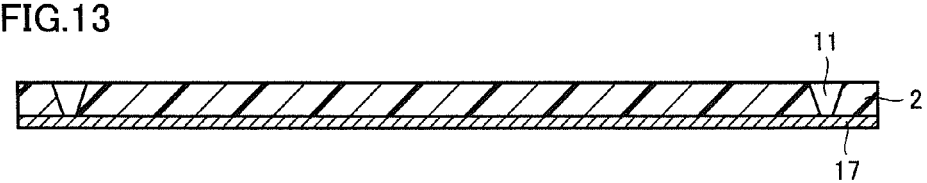
FIG. 13 is a diagram illustrating a second step of the method of manufacturing a component-embedded resin substrate based on the present invention.

Then, as shown in FIG. 13, a via hole 11 is formed to penetrate resin layer 2, by irradiating a surface on the resin layer 2 side of resin sheet with conductor foil 12 with carbon dioxide laser beams. Though via hole 11 penetrates resin layer 2, it does not penetrate conductor foil 17. Thereafter, smear (not shown) in via hole 11 is removed. Though carbon dioxide laser beams have been used for forming via hole 11 here, laser beams of other types may be used. Alternatively, in order to form via hole 11, a method other than irradiation with laser beams may be adopted.

Figure 14:
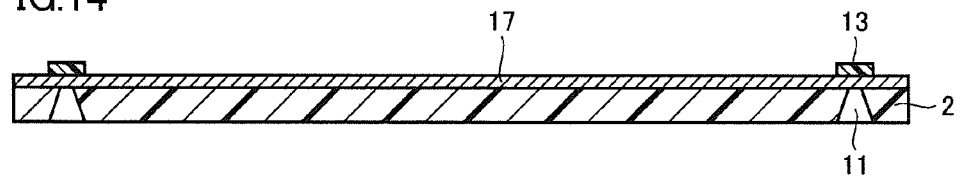
FIG. 14 is a diagram illustrating a third step of the method of manufacturing a component-embedded resin substrate based on the present invention.

Then, as shown in FIG. 14, a resist pattern 13 corresponding to a desired circuit pattern is printed on a surface of conductor foil 17 of resin sheet with conductor foil 12, with such a method as screen printing.

Figure 15:
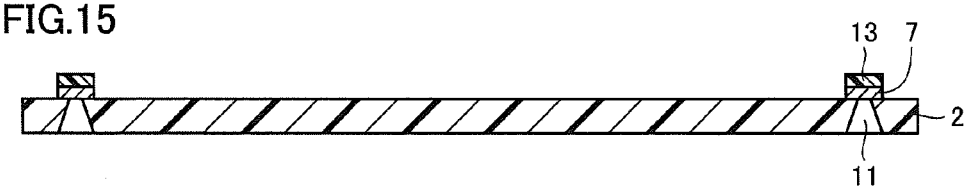
FIG. 15 is a diagram illustrating a fourth step of the method of manufacturing a component-embedded resin substrate based on the present invention.
Figure 16:
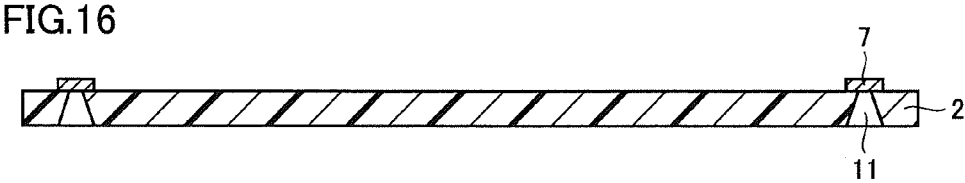
FIG. 16 is a diagram illustrating a fifth step of the method of manufacturing a component-embedded resin substrate based on the present invention.

Then, etching is performed with resist pattern 13 serving as a mask, and a portion of conductor foil 17 not covered with resist pattern 13 is removed as shown in FIG. 15. A portion of conductor foil 17 which remained after this etching is referred to as "conductor pattern 7". Thereafter, as shown in FIG. 16, resist pattern 13 is removed. Thus, desired conductor pattern 7 is obtained on one surface of resin layer 2.

Figure 17:
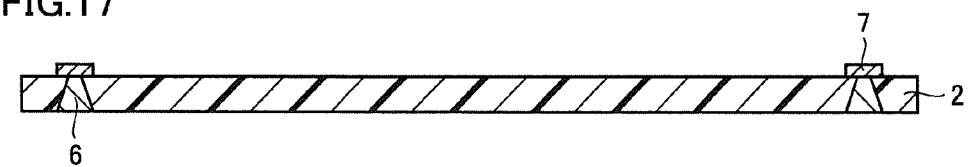
FIG. 17 is a diagram illustrating a sixth step of the method of manufacturing a component-embedded resin substrate based on the present invention.

Then, as shown in FIG. 17, via hole 11 is filled with a conductive paste by hole embedment with paste. Hole embedment with paste is carried out from a surface on a lower side in FIG. 16. Though FIGS. 16 and 17 show via hole 11 in a position facing downward for the sake of convenience of illustration, actually, hole embedment with paste may suitably be carried out at a different position. Though a conductive paste for filling may be composed mainly of silver as described above, it may be composed mainly, for example, of copper instead. This conductive paste preferably contains an appropriate amount of such metal powders as forming an alloy layer between the conductive paste and a metal which is a material for conductor pattern 7 at a temperature for subsequent thermocompression of stacked resin layers (hereinafter referred to as a "thermocompression temperature"). Since this conductive paste contains copper, that is, Cu, as a main component for exhibiting conductivity, this conductive paste preferably contains at least one of Ag, Cu, and Ni and at least one of Sn, Bi, and Zn, in addition to the main component. Via conductor 6 is thus formed.

Figure 18:
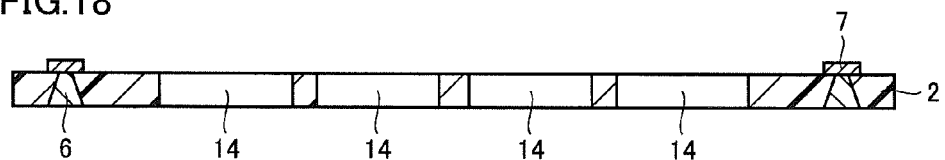
FIG. 18 is a diagram illustrating a seventh step of the method of manufacturing a component-embedded resin substrate based on the present invention.

Then, as a step S2, as shown in FIG. 18, a through hole 14 having an area greater than a projection area of embedded component 3 is formed by punching resin layer 2. The plurality of resin layers 2 to be laminated include those in which through hole 14 is formed and those in which no through hole 14 is formed. Among the plurality of resin layers 2, in accordance with design, through hole 14 is formed only in resin layers 2 in which through hole 14 is to be formed. Though FIG. 18 shows that four through holes 14 are formed by way of example, this is merely an example and the number of through holes 14 is not limited to four.

Figure 19:
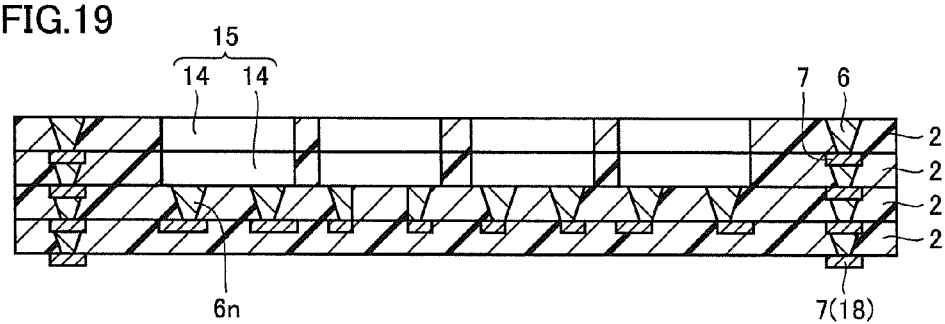
FIG. 19 is a diagram illustrating an eighth step of the method of manufacturing a component-embedded resin substrate based on the present invention.

As a step S3, as shown in FIG. 19, a plurality of resin layers 2 are stacked to form a substrate. In a lowermost layer of the substrate, resin layer 2 is arranged so that a surface of resin layer 2 on which conductor pattern 7 is formed faces downward so as to arrange conductor pattern 7 on the lower surface of the substrate. Thus, conductor pattern 7 arranged on the lower surface of the substrate serves as an external electrode 18. In the vicinity of the lower surface of the substrate, resin layer 2 in which no through hole 14 is formed is employed.

After one resin layer 2 or two or more resin layers 2 in which no through hole 14 is formed is/are stacked, resin layer 2 in which through hole 14 has been formed is stacked. In the example shown in FIG. 19, after two resin layers 2 in which no through hole 14 is formed are arranged, two resin layers 2 in which through hole 14 has been formed are layered. With the combination of through holes 14 in two or more layers, a component accommodation portion 15 as a cavity is formed. It is noted that the number of resin layers 2 in which through hole 14 has been formed may be only one, depending on a size of embedded component 3. Component accommodation portion 15 is a recess portion having such a depth that is capable of accommodating embedded component 3.

As shown in FIG. 19, at the time point when resin layers 2 are stacked sufficiently to form component accommodation portion 15, provisional press-bonding is carried out at a temperature lower than a thermocompression temperature. A temperature for provisional press-bonding is, for example, not lower than 150° C. and not higher than 200° C. By provisional press-bonding, resin layers 2 stacked by this time point are connected and component accommodation portion 15 is formed as a stable recess portion.

Figure 20:
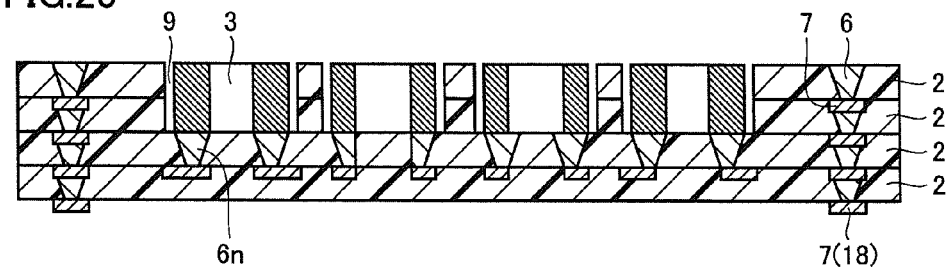
FIG. 20 is a diagram illustrating a ninth step of the method of manufacturing a component-embedded resin substrate based on the present invention.
Figure 24:
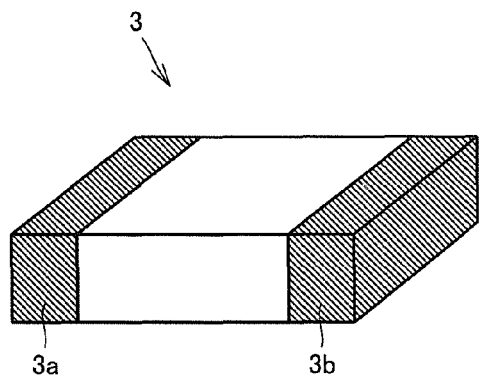
FIG. 24 is a perspective view of an embedded component based on the conventional art.
Figure 25:
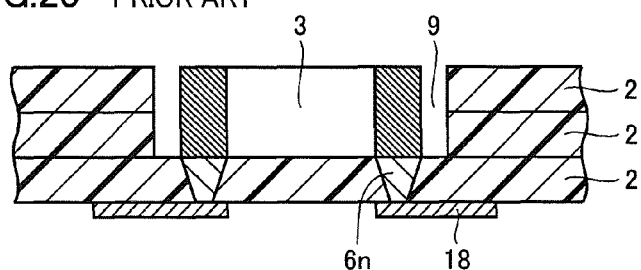
FIG. 25 is a cross-sectional view in a state that an embedded component is arranged in a recess portion formed in a stack of resin layers in an intermediate stage of manufacturing a component-embedded resin substrate based on the conventional art.
Figure 26:
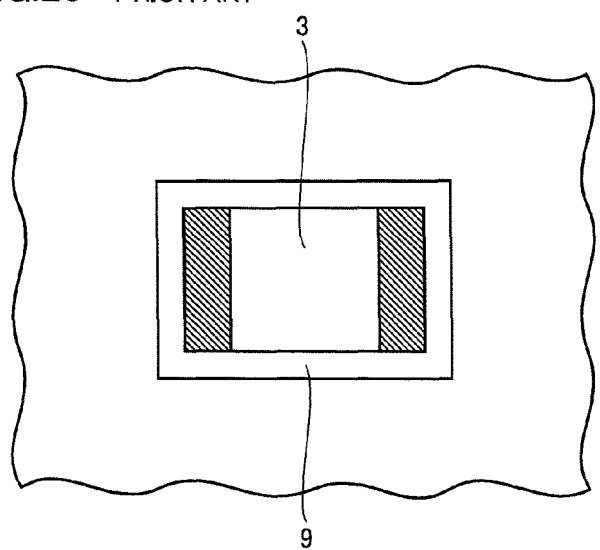
FIG. 26 is a plan view in a state that the embedded component is arranged in the recess portion formed in the stack of resin layers in the intermediate stage of manufacturing a component-embedded resin substrate based on the conventional art.

As a step S4, as shown in FIG. 20, embedded component 3 is arranged in component accommodation portion 15. In the example shown here, embedded component 3 is in a parallelepiped shape. Though embedded component 3 has electrodes 3a, 3b at respective opposing ends in the longitudinal direction as shown in FIG. 24, a shape or a structure of embedded component 3 is not limited as such.

Figure 21:
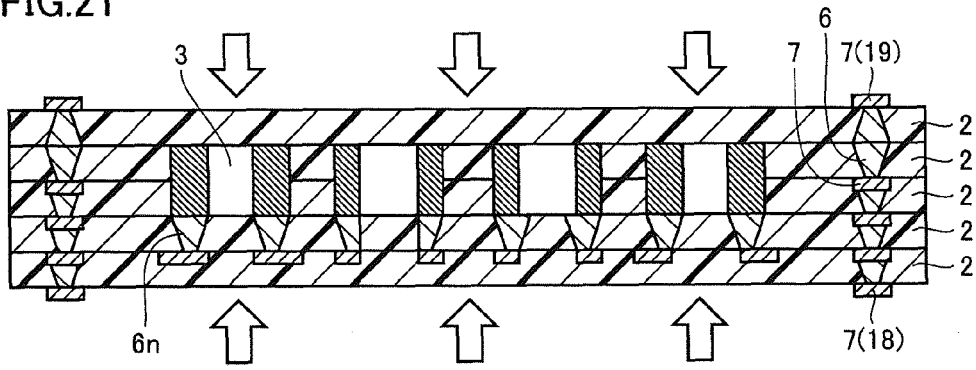
FIG. 21 is a diagram illustrating a tenth step of the method of manufacturing a component-embedded resin substrate based on the present invention.

Then, as shown in FIG. 21, resin layer 2 is further arranged on embedded component 3. This resin layer 2 does not have through hole 14. Conductor pattern 7 formed on resin layer 2 located at an uppermost layer of the substrate serves as an external electrode 19 for mounting other IC components or the like. In the example shown in FIG. 21, though one resin layer 2 is layered as compared with FIG. 20, two or more resin layers may be layered, without being limited to one layer.

Then, as a step S5, this stack is fully press-bonded. In the step of full press-bonding, the stack already provisionally press-bonded and resin layer 2 stacked after provisional press-bonding are together subjected to thermocompression in their entirety. A temperature for full press-bonding is, for example, not lower than 250° C. and not higher than 300° C. The "thermocompression temperature" described above means this temperature of full press-bonding. With full press-bonding, resin layers 2 adjacent in a direction of thickness adhere to each other and an integrated insulating base material is formed. In a case that a thermoplastic resin is employed as a material for resin layer 2, a material for resin layer 2 is softened and fluidized through thermocompression. Therefore, gap 9 is filled with a fluidized material for resin layer 2 therearound. After full press-bonding is completed, the respective surfaces of external electrodes 18, 19 formed on the upper surface and the lower surface of the component-embedded resin substrate are preferably plated with Ni, Au, or the like.

Figure 22:
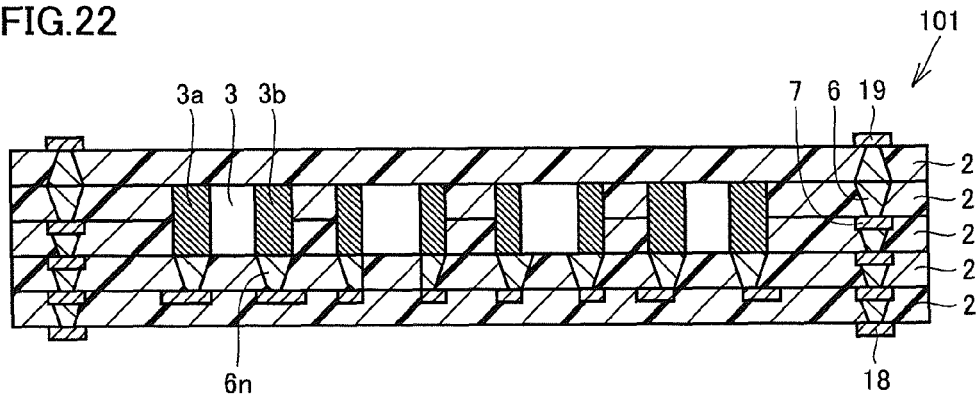
FIG. 22 is a cross-sectional view of a component-embedded resin substrate obtained with the method of manufacturing a component-embedded resin substrate based on the present invention.
Figure 23:
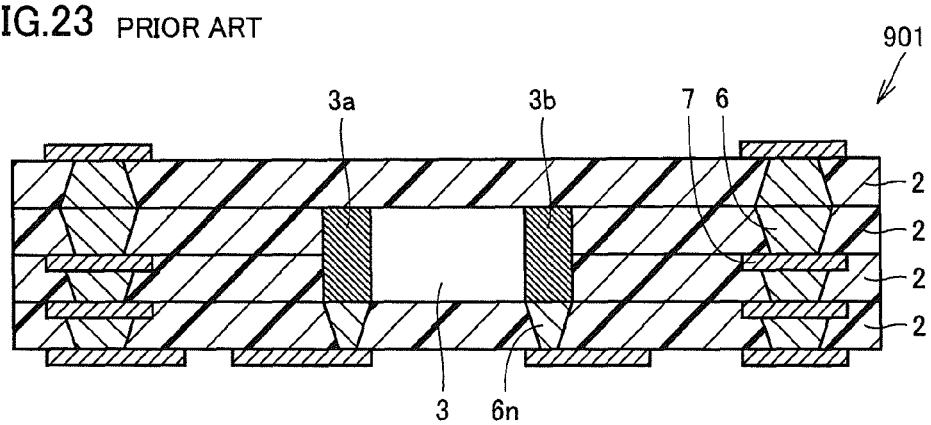
FIG. 23 is a cross-sectional view of a component-embedded resin substrate based on the conventional art.

Component-embedded resin substrate 101 is thus obtained as shown in FIG. 22. Since FIG. 22 is a cross-sectional view, it appears that four embedded components 3 are simply aligned. When viewed in a plan view, however, they are disposed in a positional relation as shown in FIG. 2.

Component-embedded resin substrates 102, 103 described in the embodiments so far can also be obtained with a similar manufacturing method.

It should be noted that the above embodiments disclosed herein are illustrative and non-restrictive in every respect. The scope of the present invention is defined by the terms of the claims, rather than the description above, and is intended to include any modifications within the scope and meaning equivalent to the terms of the claims.

The present invention can be made use of for a component-embedded resin substrate.

1 resin structure; 2 resin layer; 3 embedded component; 3a, 3b, 3e electrode; 5 end surface; 6, 6n via conductor; 7 conductor pattern; 9 gap; 11 via hole; 12 resin sheet with conductor foil; 13 resist pattern; 14 through hole; 15 component accommodation portion; 17 conductor foil; 18, 19 external electrode; 31 first embedded component; 32 second embedded component; 33 third embedded component; 36 reference embedded component; 37 another embedded component; 41 long side; 42 short side; 46, 47 straight line; 90 orientation; 91, 92 direction; 101, 102, 103 component-embedded resin substrate; and 901 (conventional) component-embedded resin substrate.

The invention claimed is:

1. A component-embedded resin substrate, comprising:
a resin structure including a plurality of laminated resin layers and having an end surface surrounding an outer periphery of said resin layers; and
a plurality of embedded components arranged as embedded in said resin structure,
said plurality of embedded components including a first embedded component and a second embedded component,
when viewed in a direction of the lamination, a first distance which is a distance from said first embedded component to a portion of said end surface closest to said first embedded component being shorter than a second distance which is a distance from said second embedded component to a portion of said end surface closest to said second embedded component, and
a first projection area calculated by multiplying a length of said first embedded component along said end surface when said first embedded component is projected on a portion of said end surface closest to said first embedded component when viewed in the direction of the lamination by a thickness of said first embedded component being smaller than a second projection area calculated by multiplying a length of said second embedded component along said end surface when said second embedded component is projected on a portion of said end surface closest to said second embedded component when viewed in the direction of the lamination by a thickness of said second embedded component.

2. The component-embedded resin substrate according to claim 1, wherein
said plurality of embedded components include a third embedded component,
when viewed in the direction of the lamination, a third distance which is a distance from said third embedded component to a portion of said end surface closest to said third embedded component is longer than said second distance, and
a third projection area calculated by multiplying a length of said third embedded component along said end surface when said third embedded component is projected on a portion of said end surface closest to said third embedded component when viewed in the direction of the lamination by a thickness of said third embedded component is greater than said second projection area.

3. The component-embedded resin substrate according to claim 1, wherein
each of said plurality of embedded components has a rectangular outer geometry when viewed in the direction of the lamination and has a rectangular electrode with a long side and a short side so as to be overlapped with a line of said rectangular outer geometry at an end portion of said rectangular outer geometry when viewed in the direction of the lamination, and when any one embedded component arbitrarily selected from said plurality of embedded components is defined as a reference embedded component, another embedded component closest to said reference embedded component is arranged at such a position that at least a part of said another embedded component is included in a region lying between two straight lines drawn perpendicularly to said short side outward from said reference embedded component, from opposing ends of a side of said reference embedded component overlapping with said short side of said electrode.

* * * * *